US006954104B2

(12) United States Patent
Metheny et al.

(10) Patent No.: US 6,954,104 B2
(45) Date of Patent: Oct. 11, 2005

(54) METHOD AND SYSTEM FOR MONITORING A DELIVERABLE RADIO FREQUENCY POWER OF AN AMPLIFIER OPERABLE ON A MONOLITHIC MICROWAVE INTEGRATED CIRCUIT

(75) Inventors: Glen C. Metheny, Raleigh, NC (US); Bernard Geller, Durham, NC (US)

(73) Assignee: Renesas Technology America, Inc., San Jose, CA (US)

(*) Notice: Subject to any disclaimer, the term of this patent is extended or adjusted under 35 U.S.C. 154(b) by 0 days.

(21) Appl. No.: 10/385,500

(22) Filed: Mar. 12, 2003

(65) Prior Publication Data

US 2004/0178847 A1 Sep. 16, 2004

(51) Int. Cl.[7] ................................................ H03G 3/20
(52) U.S. Cl. ................................... 330/140; 330/207 P
(58) Field of Search .............................. 330/140, 207 P, 330/298, 129, 136

(56) References Cited

U.S. PATENT DOCUMENTS

| | | | |
|---|---|---|---|
| 3,516,024 A | | 6/1970 | Lange |
| 4,758,776 A | | 7/1988 | Griffin |
| 4,937,541 A | | 6/1990 | Podell et al. |
| 5,977,831 A | * | 11/1999 | Davis et al. ................. 330/279 |
| 6,137,357 A | * | 10/2000 | Dekker ....................... 330/129 |
| 6,369,635 B2 | * | 4/2002 | Weiss et al. ................. 327/330 |
| 6,525,605 B2 | * | 2/2003 | Hu et al. ..................... 330/132 |
| 2001/0048311 A1 | | 12/2001 | Turski et al. |

FOREIGN PATENT DOCUMENTS

| | | |
|---|---|---|
| WO | 01/65267 A1 | 9/2001 |
| WO | 01/73887 A2 | 10/2001 |

* cited by examiner

*Primary Examiner*—Henry Choe
(74) *Attorney, Agent, or Firm*—Burns, Doane, Swecker & Mathis, LLP

(57) ABSTRACT

A method and system are described for monitoring a deliverable radio frequency (RF) power of an amplifier operable on a monolithic microwave integrated circuit (MMIC). According to an exemplary embodiment, circuitry is configured to capture, on the MMIC, a first portion of an RF signal transmitted from the amplifier to a load, and a second portion of the RF signal reflected from the load back to the amplifier. Circuitry is also configured to generate, on the MMIC, a first signal proportional to an RF power of the first portion of the RF signal, and a second signal proportional to an RF power of the second portion of the RF signal. Additional circuitry is configured to subtract a first reference signal from the first signal to produce a third signal, and a second reference signal from the second signal to produce a fourth signal. Finally, circuitry is configured to subtract the fourth signal from the third signal to produce an output signal proportional to the deliverable RF power of the amplifier to the load.

17 Claims, 3 Drawing Sheets

US 6,954,104 B2

METHOD AND SYSTEM FOR MONITORING A DELIVERABLE RADIO FREQUENCY POWER OF AN AMPLIFIER OPERABLE ON A MONOLITHIC MICROWAVE INTEGRATED CIRCUIT

BACKGROUND

Techniques in radio frequency (RF) power detection are described. More particularly, a method and system are described for monitoring a deliverable RF power of an amplifier operable on a monolithic microwave integrated circuit (MMIC).

While power detection methods exist for determining a delivered power of MMIC power amplifiers in module or packaged applications, they are limited to monitoring power output to a load through a combination of an off-chip directional coupler and a power detector. Some MMICs include on-chip detectors, but these detectors only monitor the available power of the amplifier. Using an on-chip detector for sensing the available power if an amplifier does not adequately describe the true power delivered by the output circuit.

SUMMARY

Accordingly, a method and system are disclosed for monitoring a deliverable RF power of an amplifier operable on an MMIC. According to exemplary embodiments, circuitry is configured to capture, on the MMIC, a first portion of an RF signal transmitted from the amplifier to a load, and a second portion of the RF signal reflected from the load back to the amplifier. Circuitry is also configured to generate, on the MMIC, a first signal proportional to an RF power of the first portion of the RF signal, and a second signal proportional to an RF power of the second portion of the RF signal. Additional circuitry is configured to subtract a first reference signal from the first signal to produce a third signal, and a second reference signal from the second signal to produce a fourth signal. Finally, circuitry is configured to subtract the fourth signal from the third signal to produce an output signal proportional to the deliverable RF power of the amplifier to the load.

According to another exemplary embodiment, a system is integrated on a monolithic microwave integrated circuit (MMIC) including a four port bi-directional coupler. The coupler includes a first port directly connected to an output terminal of the amplifier, a second port directly connected to a load, a third port electromagnetically coupled to the first port, and fourth port electromagnetically coupled to the second port. A first RF diode has a first terminal directly connected to the third port of the coupler. A second RF diode has a first terminal directly connected to the fourth port of the coupler. A first differential amplifier has a first input connected to a second terminal of the first RF diode and a second input connected to a third RF diode. A second differential amplifier has a first input connected to a second terminal of the second RF diode and a second input connected to a fourth RF diode. A third differential amplifier, having first and second inputs connected to respective outputs of the first and second differential amplifiers, is configured to generate a differential voltage proportional to an RF power of the amplifier when transmitting an RF signal to the load.

BRIEF DESCRIPTION OF THE DRAWINGS

Other objects and advantages of the described techniques will become apparent to those skilled in the art upon reading the following detailed description, in conjunction with the accompanying drawings, wherein like reference numerals have been used to designate like elements, and wherein.

DETAILED DESCRIPTION

To determine the true power delivered by an RF amplifier, both a forward (or incident) power ($P_I$) and a reflected power ($P_R$) of an RF signal delivered from the amplifier to a load must be determined. Disregarding device losses, the true power, P, delivered to the load can be calculated as:

$$P = P_I - P_R$$

Signals proportional to the incident and reflected powers of the RF signal can be converted to a measurable quantity such as a voltage. The difference of the voltages representing the incident and reflected power can be taken to yield a differential voltage that is proportional to the true power delivered from the amplifier to the load.

Figure 1:
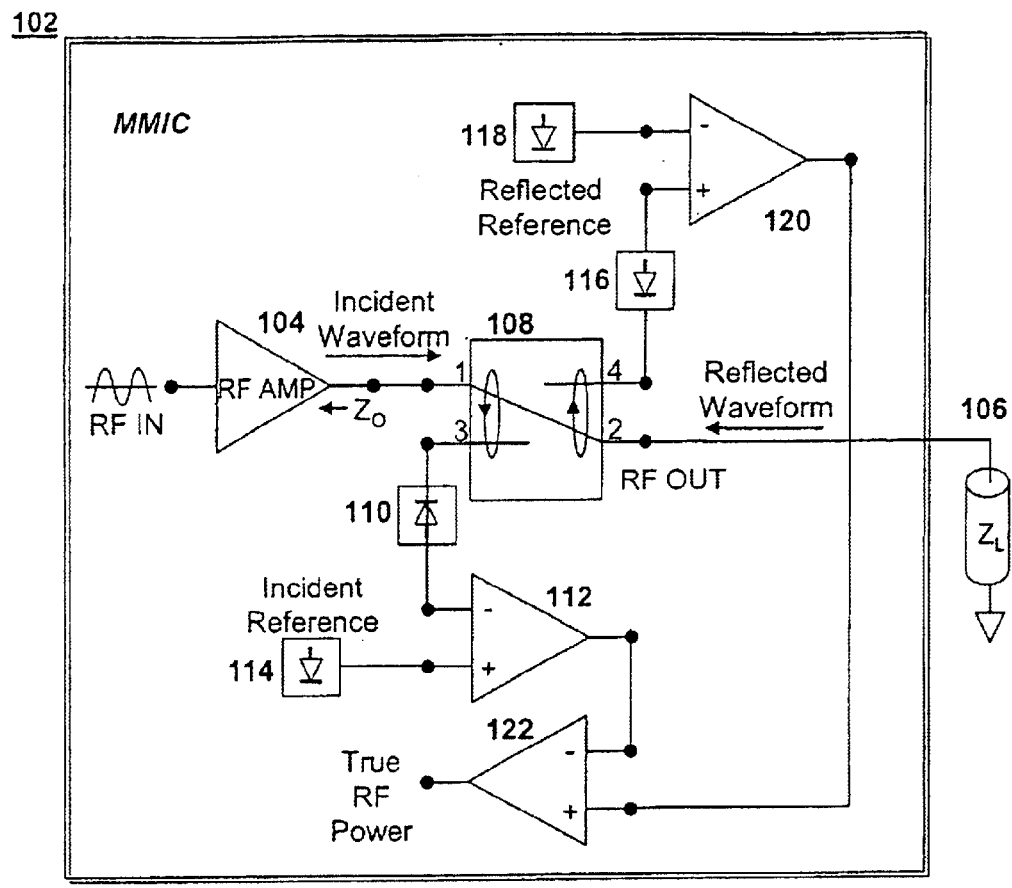
FIG. 1 depicts an arrangement for monitoring a deliverable RF power of an amplifier operable on an MMIC according to an exemplary embodiment.

FIG. 1 depicts an arrangement for monitoring a deliverable RF power of an amplifier operable on an MMIC. The figure shows a MMIC 102 having an RF amplifier 104 configured to deliver an RF signal to a load 106. The load 106 can be physically located on the MMIC (on-chip), or can be physically located external to the MMIC (off-chip), e.g., and off-chip antenna (not shown).

The arrangement includes circuitry configured to capture, on the MMIC, a first portion of the RF signal transmitted from the amplifier to a load, and a second portion of the RF signal reflected from the load back to the amplifier. For example, the circuitry configured to capture can be a four port bi-directional coupler 108 as shown in FIG. 1. The coupler 108 can include a first port directly connected to an output terminal of the amplifier 104. A second port of the coupler 108 can be directly connected to the load 106. Third and fourth ports of the coupler 108 can be electromagnetically coupled to the first and second ports of the coupler 108, respectively.

The four port bi-directional coupler 108 can be configured to couple a first portion of the RF signal, injected into the first port of the coupler 108 by the amplifier 104, into the third port of the coupler 108. The first portion represents a portion of the incident waveform part of the RF signal, i.e., the portion of the RF signal traveling from the amplifier 104 to the load 106. The coupler 108 is configured such that only a portion of the incident waveform entering the first port of the coupler 108 is coupled into the third port of the coupler 108 (e.g., downward arrow indicating a first directional coupling).

If the load 106 impedance $Z_L$ is not matched perfectly to the output impedance $Z_O$ of the amplifier 104, a portion of the RF signal transmitted by the amplifier 104 will be reflected back from the load 106. The coupler 108 can be configured to couple a second portion of the RF signal reflected into the second port of the coupler 108 from the load 106 into the fourth port of the coupler 108. The second portion represents a portion of the reflected waveform part of the RF signal, i.e., the portion of the RF signal traveling from the load 106 to the amplifier 104. Again, the coupler 108 is configured such that only a portion of the reflected waveform entering the second port of the coupler 108 is coupled into the fourth port of the coupler 108 (e.g., up arrow indicating a second directional coupling, opposite to the first directional coupling).

Figure 2:
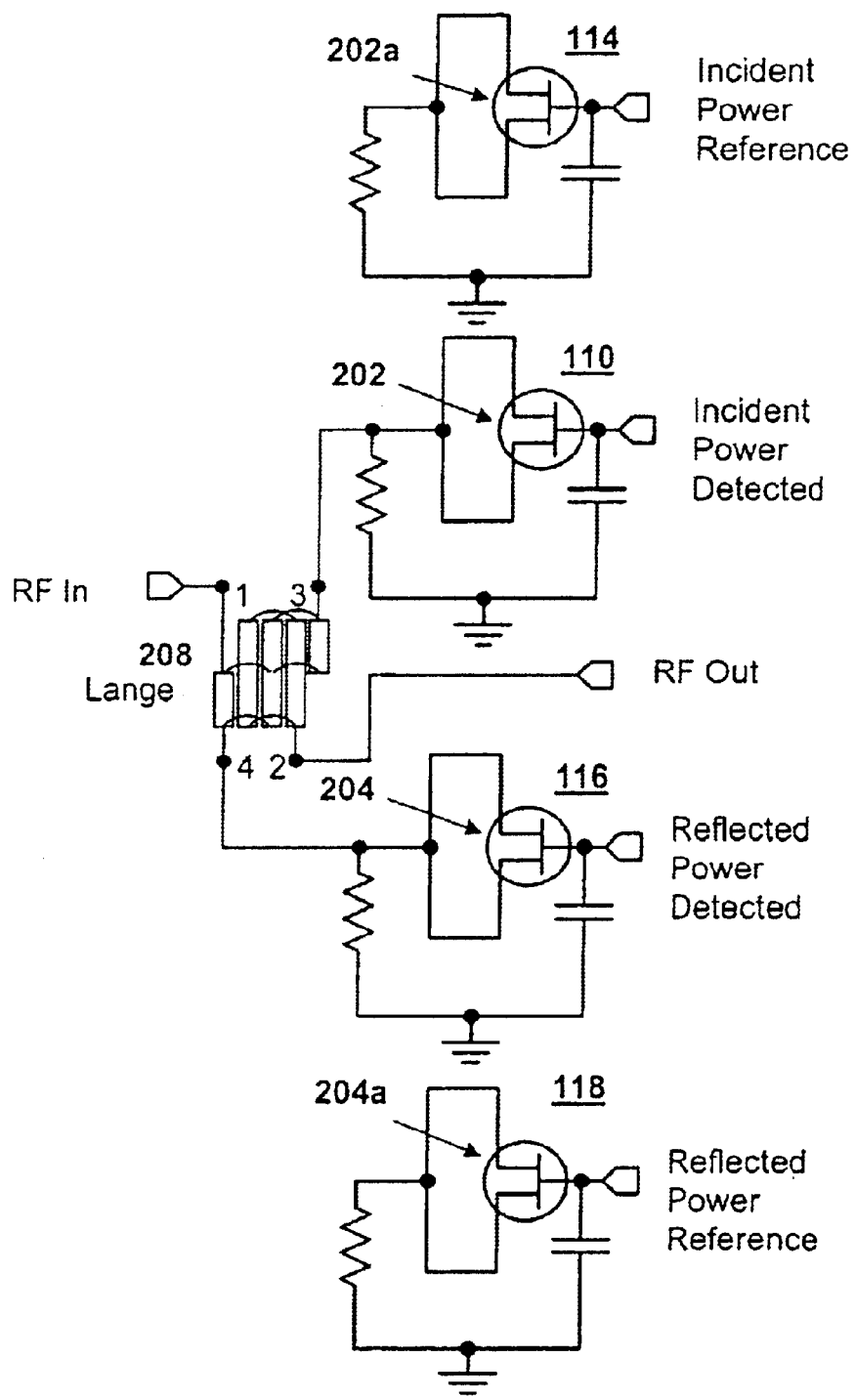
FIG. 2 depicts circuitry included in the exemplary arrangement shown in FIG. 1.

Instead of using a conventional edge-coupled strip transmission line directional coupler or a simple resistor tap to sample output power in one direction, the coupler 108 can be a Lange coupler 208 as shown in FIG. 2, designed to sample both the incident and reflected portions of the RF signal. The Lange coupler 208 can be foreshortened to respond to signals about $1/40^{th}$ of a wavelength of a center frequency of the RF signal being transmitted from the amplifier 104 to the load 106. The line widths and separation values of the Lange coupler 208 can be optimized for maximum signal transfer to compensate for being foreshortened. The design of Lange couplers is well known to the art of microwave design, and need not be discussed here in detail.

The arrangement of FIG. 1 further includes circuitry 110 configured to generate, on the MMIC, a first signal proportional to an RF power of the first portion of the RF signal, and circuitry 116 configured to generate a second signal proportional to an RF power of the second portion of the RF signal. The circuitry 110 can include a first RF diode 202, having a first terminal directly connected to the third port, configured to convert the first portion of the RF signal into a first voltage proportional to the incident power of the RF signal. Similarly, the circuitry 116 can include a second RF diode 204, having a first terminal directly connected to the fourth port, configured to convert the second portion of the RF signal into a second voltage proportional to the reflected power of the RF signal.

The RF diodes 202/204 are preferably operated in the square-law region, and can produce output voltages that are linearly proportional to the incident and reflected powers of the RF signal coupled into the third and fourth ports of the coupler 108, respectively. As shown in FIG. 2, the circuitry 110/116 can also include a resistor and capacitor pair to generate a discernible voltage.

The arrangement of FIG. 1 further includes circuitry 112 configured to subtract a first reference signal from the first signal to produce a third signal, and circuitry 120 configured to subtract a second reference signal from the second signal to produce a fourth signal. The first and second reference signals can be generated using reference circuitry 114/118 substantially similar to the detection circuitry 110/116 configured to generate the first and second voltages proportional to the incident and reflected powers of the RF signal.

The reference circuitry 114/118 can be configured to generate reference signals that replicate the nominal DC biases and remove temperature variation and process variation produced by the detection circuitry 110/116. These reference signals can then be subtracted from the first and second signals generated by the detection circuitry 110/116, thus reducing variations in the detection signals caused by temperature and/or process variations in the MMIC. The detection circuitry 114/118 is preferable isolated from RF power on the MMIC to generate accurate reference values.

The reference circuitry 114/118 can include third and fourth RF diodes 202a/204a that are substantially similar (in both orientation and design) to the first and second RF diodes 202/204, respectively. The diodes 202a/204a are again preferably biased in the square-law region, and produce respective output voltages corresponding to the quiescent operating points of the diodes 202/204 included in the detection circuitry 110/116. Like the detection circuitry 110/116, the reference circuitry 114/118 can also include resistor/capacitor pairs to remove temperature variations and process variations from the measurement.

As shown in FIG. 1, the circuitry 112 configured to subtract the first reference signal from the first signal can include a first differential amplifier having a first input connected to a second terminal of the first RF diode 202 included in the detection circuitry 110, and a second terminal connected to the third RF diode 202a included in the reference circuitry 114. The first differential amplifier 112 is configured to amplify a difference between the first voltage generated by the detection circuitry 110 and the first reference voltage generated by the reference circuitry 114. The differential voltage produced by the amplifier 112 is proportional to the incident power of the RF signal, and is adjusted to account for temperature and/or process variations in the MMIC.

Similarly, the circuitry 120, configured to subtract the second reference signal from the second signal can include a second differential amplifier having a first input connected to a second terminal of the second RF diode 204 included in the detection circuitry 116, and a second terminal connected to the third RF, diode 204a included in the reference circuitry 118. The second differential amplifier 120 is configured to amplify a difference between the second voltage generated by the detection circuitry 116 and the second reference voltage generated by the reference circuitry 118. The differential voltage produced by the amplifier 120 is proportional to the reflected power of the RF signal, and is again adjusted to account for temperature and/or process variations in the MMIC.

The arrangement of FIG. 1 further includes circuitry 122 configured to subtract the fourth signal from the third signal to produce an output signal proportional to the deliverable RF power of the amplifier to the load. The circuitry 122 can include a third differential amplifier having a first input connected to an output of the first differential amplifier 112 and second terminal connected to an output of the second differential amplifier 120. The third differential amplifier can be configured to amplify a difference between the first and second differential voltages produced by the amplifiers 112/120 to generate an output differential voltage proportional to the deliverable RF power of the amplifier to the load. An analog-to-digital converter (not shown) can be configured to convert the output differential voltage into a digital representation of the deliverable RF power of the amplifier to the load.

Figure 3:
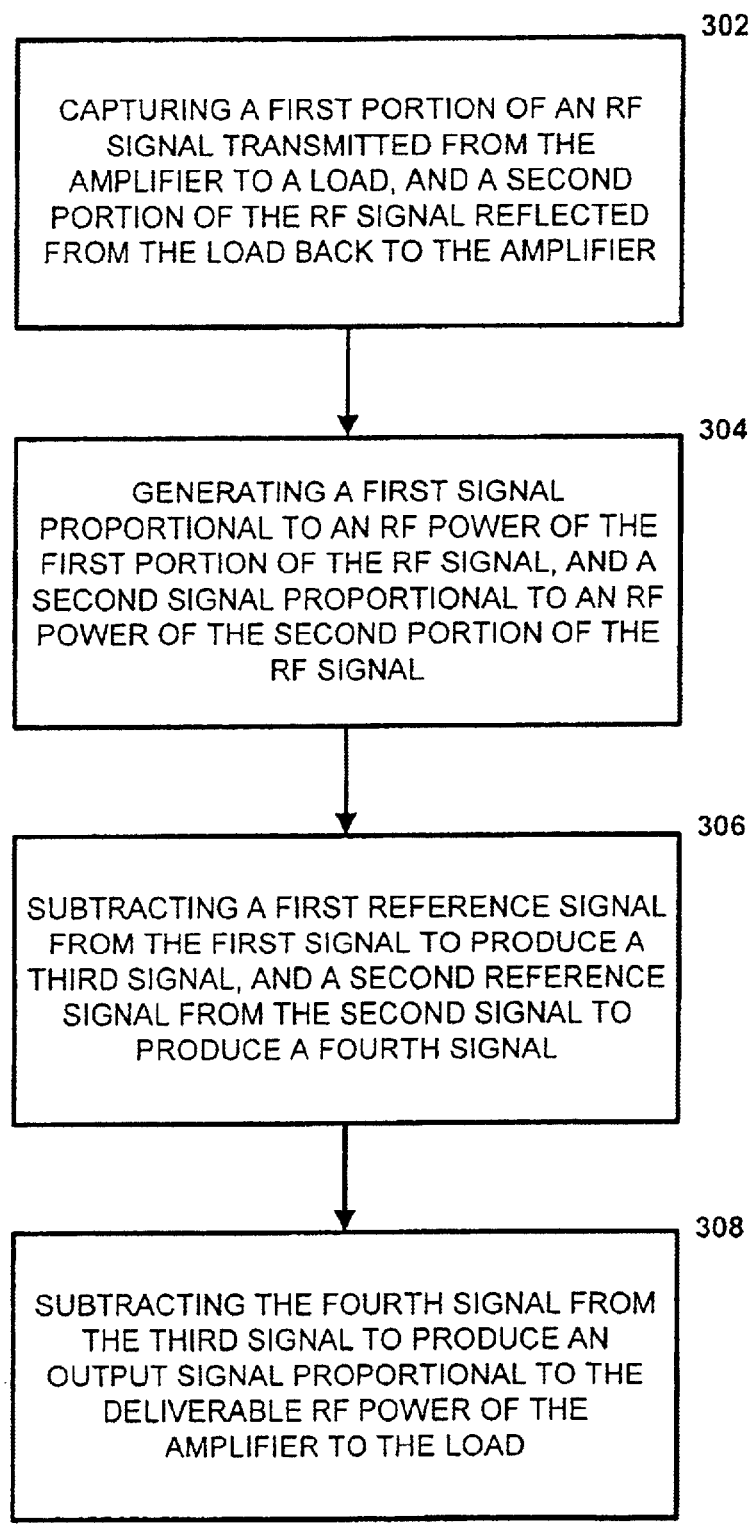
FIG. 3 is a flowchart illustrating steps for monitoring a deliverable RF power of an amplifier operable on an MMIC.

FIG. 3 depicts a flowchart illustrating steps for monitoring a deliverable RF power of an amplifier operable on an MMIC. In step 302 a first portion of an RF signal transmitted from the amplifier to a load, and a second portion of the RF signal reflected from the load back to the amplifier are captured on the MMIC. In step 304, a first signal is generated on the MMIC that is proportional to an RF power of the first portion of the RF signal, and a second signal is generated that is proportional to an RF power of the second portion of the RF signal. In step 306, a first reference signal is subtracted from the first signal to produce a third signal, and a second reference signal is subtracted from the second signal to produce a fourth signal. In step 308, the fourth signal is subtracted from the third signal to produce an output signal proportional to the deliverable RF power of the amplifier to the load.

According to exemplary embodiments, the capturing can include coupling the first and second portions of the RF signal into circuitry capable of generating the first and second signals using a four port bi-directional coupler. The generating can included converting the first portion of the RF signal into a first voltage corresponding to the first signal using a first RF diode, and the second portion of the RF signal into a second voltage corresponding to the second signal using a second RF diode.

A first reference voltage can be generated on the MMIC corresponding to the first reference signal using a third RF diode substantially similar to the first RF diode, and a second reference voltage can be generated corresponding to the second reference signal using a fourth RF diode substantially similar to the second RF diode. The subtracting the first and second reference signals can include amplifying a difference between the first voltage and the first reference voltage to generate a first differential voltage corresponding to the third signal. In addition, a difference can be amplified between the second voltage and the second reference voltage to generate a second differential voltage corresponding to the fourth signal.

The subtracting the fourth signal from the third signal, can include amplifying a difference between the first and second differential voltages to generate an output differential voltage corresponding to the output signal proportional to the deliverable RF power of the amplifier to the load. The output differential voltage can be converted into a digital representation of the deliverable RF power of the amplifier to the load using an analog-to-digital converter.

Various aspects have been described in connection with exemplary embodiments. To facilitate an understanding of these embodiments, many aspects are described in terms of sequences of actions that can be performed by elements of a computer system. For example, it will be recognized that in each of the embodiments, the various actions can be performed by specialized circuits or circuitry (e.g., discrete logic gates and/or electronic devices interconnected to perform a specialized function), by program instructions being executed by one or more processors, or by a combination of both. Moreover, the exemplary embodiments can be considered part of any form of computer readable storage medium having stored therein an appropriate set of computer instructions that would cause a processor to carry out the techniques described herein.

Thus, the various aspects can be embodied in many different forms, and all such forms are contemplated to be within the scope of what is described. For each of the various aspects, any such form of embodiment can be referred to herein as "logic configured to" or "circuitry configured to" perform a described action.

It will be appreciated by those of ordinary skill in the art that the present invention can be embodied in various specific forms without departing from the spirit or essential characteristics thereof. The presently disclosed embodiments are considered in all respects to be illustrative and not restrictive. The scope of the invention is indicated by the appended claims, rather than the foregoing description, and all changes that come within the meaning and range of equivalence thereof are intended to be embraced.

What is claimed is:

1. A system for monitoring a deliverable RF power of an amplifier operable on a monolithic microwave integrated circuit (MMIC), the system comprising:
   circuitry configured to capture, on the MMIC, a first portion of an RF signal transmitted from the amplifier to a load, and a second portion of the RF signal reflected from the load back to the amplifier;
   circuitry configured to generate, on the MMIC, a first signal proportional to an RF power of the first portion of the RF signal, and a second signal proportional to an RF power of the second portion of the RF signal;
   circuitry configured to subtract a first reference signal from the first signal to produce a third signal, and a second reference signal from the second signal to produce a fourth signal; and
   circuitry configured to subtract the fourth signal from the third signal to produce an output signal proportional to the deliverable RF power of the amplifier to the load.

2. The system of claim 1, wherein the circuitry configured to capture comprises:
   a four port bi-directional coupler, the coupler including:
      a first port directly connected to an output terminal of the amplifier;
      a second port directly connected to the load;
      a third port being directly connected to the circuitry configured to generate the first signal and electromagnetically coupled to the first port; and
      a fourth port directly connected to the circuitry configured to generate the second signal and electromagnetically coupled to the second port.

3. The system of claim 2, wherein the circuitry configured to generate comprises:
   a first RF diode, having a first terminal directly connected to the third port, configured to convert the first portion of the RF signal into a first voltage corresponding to the first signal; and
   a second RF diode, having a first terminal directly connected to the fourth port, configured to convert the second portion of the RF signal into a second voltage corresponding to the second signal.

4. The system of claim 3, comprising:
   a third RF diode, substantially similar to the first RF diode, configured to generate a first reference voltage on the MMIC corresponding to the first reference signal; and
   a fourth RF diode, substantially similar to the second RF diode, configured to generate a second reference voltage on the MMIC corresponding to the second reference signal.

5. The system of claim 4, wherein the circuitry configured to subtract the first and second reference signals comprises:
   a first differential amplifier, having a first input connected to a second terminal of the first RF diode and a second terminal connected to the third RF diode, configured to amplify a difference between the first voltage and the first reference voltage to generate a first differential voltage corresponding to the third signal; and
   a second differential amplifier, having a first input connected to a second terminal of the second RF diode and a second terminal connected to the fourth RF diode, configured to amplify a difference between the second voltage and the second reference voltage to generate a second differential voltage corresponding to the fourth signal.

6. The system of claim 5, wherein the circuitry configured to subtract the fourth signal from the third signal, comprises:
   a third differential amplifier, having a first input connected to an output of the first differential amplifier and second terminal connected to an output of the second differential amplifier, configured to amplify a difference between the first and second differential voltages to generate an output differential voltage corresponding to the output signal proportional to the deliverable RF power of the amplifier to the load.

7. The system of claim 6, comprising:
   an analog-to-digital converter configured to convert the output differential voltage into a digital representation of the deliverable RF power of the amplifier to the load.

8. A system integrated on a monolithic microwave integrated circuit (MMIC) for monitoring a deliverable RF power of an amplifier operable on the MMIC, the system comprising:

a four port bi-directional coupler having a first port directly connected to an output terminal of the amplifier, a second port directly connected to a load, a third port electromagnetically coupled to the first port, and fourth port electromagnetically coupled to the second port;

a first RF diode having a first terminal directly connected to the third port of the coupler;

a second RF diode having a first terminal directly connected to the fourth port of the coupler;

a first differential amplifier having a first input connected to a second terminal of the first RF diode and a second input connected to a third RF diode;

a second differential amplifier having a first input connected to a second terminal of the second RF diode and a second input connected to a fourth RF diode; and a third differential amplifier, having first and second inputs connected to respective outputs of the first and second differential amplifiers, configured to generate a differential voltage proportional to an RF power of the amplifier when transmitting an RF signal to the load.

9. The system of claim 8, wherein the four port bi-directional coupler is a Lange coupler configured to couple a first portion of the RF signal transmitted from the amplifier to the load into the third port and a second portion of the RF signal reflected back to the amplifier from the load into the fourth port.

10. The system of claim 9, wherein the Lange coupler is foreshortened to couple RF signals about $1/40^{th}$ of the wavelength of the RF signal transmitted from the amplifier to the load.

11. A method for monitoring a deliverable RF power of an amplifier operable on a monolithic microwave integrated circuit (MMIC), the method comprising:

capturing, on the MMIC, a first portion of an RF signal transmitted from the amplifier to a load, and a second portion of the RF signal reflected from the load back to the amplifier;

generating, on the MMIC, a first signal proportional to an RF power of the first portion of the RF signal, and a second signal proportional to an RF power of the second portion of the RF signal;

subtracting a first reference signal from the first signal to produce a third signal, and a second reference signal from the second signal to produce a fourth signal; and subtracting the fourth signal from the third signal to produce an output signal proportional to the deliverable RF power of the amplifier to the load.

12. The method of claim 11, wherein the capturing comprises:

coupling the first and second portions of the RF signal into circuitry capable of generating the first and second signals using a four port bi-directional coupler.

13. The method of claim 11, wherein the generating comprises:

converting the first portion of the RF signal into a first voltage corresponding to the first signal using a first RF diode, and the second portion of the RF signal into a second voltage corresponding to the second signal using a second RF diode.

14. The method of claim 13, comprising:

generating a first reference voltage on the MMIC corresponding to the first reference signal using a third RF diode substantially similar to the first RF diode, and a second reference voltage on the MMIC corresponding to the second reference signal using a fourth RF diode substantially similar to the second RF diode.

15. The method of claim 14, wherein the subtracting the first and second reference signals comprises:

amplifying a difference between the first voltage and the first reference voltage to generate a first differential voltage corresponding to the third signal, and a difference between the second voltage and the second reference voltage to generate a second differential voltage corresponding to the fourth signal.

16. The method of claim 15, wherein the subtracting the fourth signal from the third signal, comprises:

amplifying a difference between the first and second differential voltages to generate an output differential voltage corresponding to the output signal proportional to the deliverable RF power of the amplifier to the load.

17. The method of claim 16, comprising:

converting the output differential voltage into a digital representation of the deliverable RF power of the amplifier to the load using an analog-to-digital converter.

* * * * *